United States Patent
Kang et al.

(10) Patent No.: US 7,217,642 B2
(45) Date of Patent: May 15, 2007

(54) MASK FOR CRYSTALLIZING POLYSILICON AND A METHOD FOR FORMING THIN FILM TRANSISTOR USING THE MASK

(75) Inventors: Myung-Koo Kang, Seoul (KR); Hyun-Jae Kim, Seongnam (KR); Sook-Young Kang, Seoul (KR)

(73) Assignee: Samsung Electronis Co., Ltd., Suwon-Si (KR)

( * ) Notice: Subject to any disclaimer, the term of this patent is extended or adjusted under 35 U.S.C. 154(b) by 143 days.

(21) Appl. No.: 10/495,673

(22) PCT Filed: Jan. 24, 2002

(86) PCT No.: PCT/KR02/00111

§ 371 (c)(1),
(2), (4) Date: Nov. 22, 2004

(87) PCT Pub. No.: WO03/043093

PCT Pub. Date: May 22, 2003

(65) Prior Publication Data

US 2005/0079693 A1   Apr. 14, 2005

(30) Foreign Application Priority Data

Nov. 14, 2001   (KR) ................................ 2001-70661

(51) Int. Cl.
*H01L 21/20* (2006.01)

(52) U.S. Cl. ........................ 438/486; 438/487; 257/98; 257/E21.133; 260/DIG. 35

(58) Field of Classification Search .................. 438/30, 438/149–150, 166, 486–487, 795; 257/98, 257/E21.133; 260/DIG. 35
See application file for complete search history.

(56) References Cited

U.S. PATENT DOCUMENTS

| | | | |
|---|---|---|---|
| 6,326,286 B1 * | 12/2001 | Park et al. .................. | 438/478 |
| 2001/0028985 A1 * | 10/2001 | Wang et al. .................. | 430/5 |
| 2004/0144988 A1 * | 7/2004 | Jung .......................... | 257/98 |
| 2005/0151146 A1 * | 7/2005 | Lee et al. .................... | 257/98 |
| 2005/0173752 A1 * | 8/2005 | Chung et al. ................ | 257/315 |

* cited by examiner

*Primary Examiner*—Matthew Smith
*Assistant Examiner*—Thanh Van Pham
(74) *Attorney, Agent, or Firm*—F. Chau & Associates, LLC

(57) ABSTRACT

A mask for forming polysilicon has a first slit region where a plurality of horizontal slit patterns are arranged in the vertical direction while bearing the same width, a second slit region where a plurality of horizontal slit patterns are arranged in the vertical direction while bearing the same width, a third slit region where a plurality of horizontal slit patterns are arranged in the vertical direction while bearing the same width, and a fourth slit region where a plurality of horizontal slit patterns are arranged in the vertical direction while bearing the same width. The slit patterns arranged at the first to fourth slit regions are sequentially enlarged in width in the horizontal direction in multiple proportion to the width d of the slit pattern at the first slit region. The centers of the slit patterns arranged at the first to fourth slit regions in the horizontal direction are placed at the same line. The slit patterns arranged at the respective slit regions in the vertical direction are spaced from each other with a distance of 8*d. Alternatively, the first to fourth slit regions may be arranged in reverse order, or in the vertical direction.

4 Claims, 5 Drawing Sheets

Sequential lateral solidification process

MASK FOR CRYSTALLIZING POLYSILICON AND A METHOD FOR FORMING THIN FILM TRANSISTOR USING THE MASK

BACKGROUND OF THE INVENTION (a) Field of the Invention

The present invention relates to masks forming a polysilicon (polysilicon) and a method for fabricating a thin film transistor using the same and, more particularly, to masks for crystallizing amorphous silicon into polysilicon.

(b) Description of the Related Art

Generally, a liquid crystal display has two panels with electrodes, and a liquid crystal layer sandwiched between the two panels. The two panels are sealed to each other by way of a sealer while being spaced apart from each other by way of spacers. Voltages are applied to the electrodes so that the liquid crystal molecules in the liquid crystal layer are re-oriented to thereby control the light transmission. Thin film transistors are provided at one of the panels to control the signals transmitted to the electrodes.

In the usual thin film transistors, amorphous silicon is used to form a semiconductor layer. The amorphous silicon-based thin film transistor bears a current mobility of about 0.5–1 $cm^2$/Vsec. Such a thin film transistor may be used as a switching circuit for the liquid crystal display. However, as the thin film transistor involves a low current mobility, it is inadequate for directly forming a driving circuit on the liquid crystal panel.

In order to overcome such a problem, it has been proposed that the polysilicon bearing a current mobility of about 20–150 $cm^2$/Vsec should be used to form the semiconductor layer. As the polysilicon thin film transistor involves a relatively high current mobility, a Chip In Glass where the liquid crystal panel has a built-in driving circuit can be realized.

In order to form the polysilicon thin film transistor, it has been proposed to employ a technique of directly depositing a polysilicon layer onto a substrate at high temperature, a technique of depositing an amorphous silicon layer onto a substrate and crystallizing the deposited amorphous silicon layer at 600° C., or a technique of depositing an amorphous silicon layer onto a substrate and heat-treating the deposited amorphous silicon layer using laser. However, as such techniques require high temperature processing, it becomes difficult to employ the techniques for use in processing a liquid crystal panel glass substrate. Furthermore, the uniformity related to the electrical characteristics of the neighboring thin film transistors is deteriorated due to the non-uniform crystalline particle system.

In order to solve such a problem, a sequential lateral solidification (or crystallization) process where the size distribution of the grains of the polysilicon can be controlled in an artificial manner has been developed. This is a technique based on the fact that the grains of the polysilicon are grown perpendicular to the interface between the laser-illuminated liquid phase region and the non-illuminated solid phase region. The laser beams pass through the slit-patterned transmission region of the mask, and completely melt the amorphous silicon to thereby form a slit-shaped liquid phase region at the amorphous silicon layer. Thereafter, the liquid phase amorphous silicon is crystallized while being cooled. The growth of the crystal grains begins from the boundary of the solid phase region where the laser is not illuminated while proceeding perpendicular thereto. The grain growths stop at the center of the liquid phase region while meeting there. Such a process is repeated while moving the mask slits in the growing direction of the grains so that the sequential lateral solidification can be made throughout the entire target area.

However, in case the slit width of the mask is too large, the grain growth beginning from the boundary of the slit does not proceed up to the center of the slit so that small sized particles may be formed at the center of the slit by way of homogeneous nucleation. In order to solve such a problem, the slit-patterned area may be divided into two different regions such that the slit patterns arranged at the two regions are deviated from each other, thereby making the desired crystallization.

However, even with the use of such a technique, the size of the grains of the crystalline particles cannot exceed that of the slit patterns and hence, it is yet limited to control the crystalline particle size in a desired manner.

SUMMARY OF THE INVENTION

It is an object of the present invention to provide a polysilicon formation mask for fabricating a thin film transistor which can control the grain size of the polysilicon layer in an appropriate manner.

This and other objects may be achieved by a polysilicon formation mask with a plurality of slit patterns for defining transmission regions of laser beams to be illuminated. The slit patterns are sequentially reduced or enlarged in width in a predetermined direction.

The slit patterns are arranged at two or more different regions, and the slit patterns arranged at the same region have the same width. The centers of the slit patterns arranged at the different regions in the predetermined direction are placed at the same line. The width of the slit patterns arranged in the predetermined direction is in multiple proportion to the minimal slit pattern width.

In a method of fabricating a thin film transistor using such a mask, a sequential lateral solidification process is made with respect to an amorphous silicon layer while moving the mask by the width of each slit pattern region in the predetermined direction.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components, wherein.

DETAILED DESCRIPTION OF THE PREFERRED EMBODIMENTS

Preferred embodiments of this invention will be explained with reference to the accompanying drawings.

Figure 1:
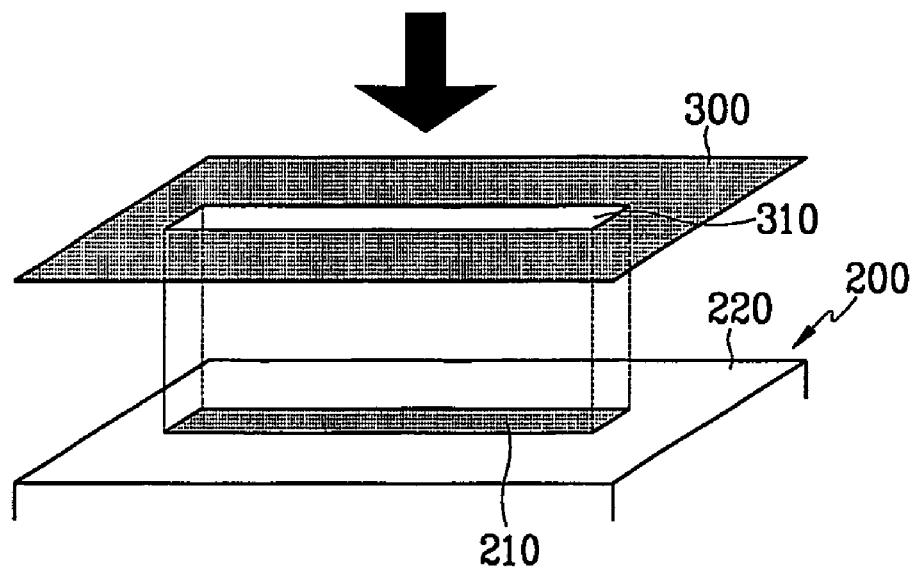
FIG. 1 schematically illustrates a sequential lateral solidification process where amorphous silicon is crystallized into polysilicon through illuminating laser thereto.
Figure 2:
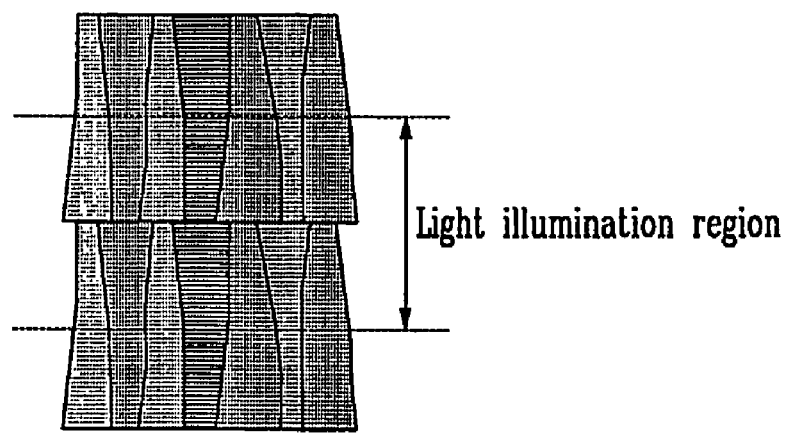
FIG. 2 illustrates the micro-structure of polysilicon during the process where amorphous silicon is crystallized into the polysilicon through the sequential lateral solidification.

FIG. 1 schematically illustrates a sequential lateral solidification process where amorphous silicon is crystallized into polysilicon, and FIG. 2 illustrates the micro-structure of the polysilicon during the process.

As shown in FIG. 1, an amorphous silicon layer 200 is formed on an insulating substrate, and laser beams are illuminated onto the amorphous silicon layer 200 through a mask 300 with a slit-patterned light transmission region 310. The amorphous silicon layer 200 is completely melted in a local manner, and a liquid phase region 210 is formed at the amorphous silicon layer 200 corresponding to the light transmission region 310 of the mask 300. At this time, the grains of the polysilicon are grown from the interface between the laser-illuminated liquid phase region 210 and the non-illuminated solid phase region 220 perpendicular thereto. The grain growths stop at the center of the liquid phase region while meeting there. When the laser beams are illuminated onto the amorphous silicon layer 200 while moving the mask slit pattern in the growing direction of the grains, the lateral grain growths continuously proceed so that the desired grain sizes can be determined.

FIG. 2 illustrates the grain structure of the polysilicon when the sequential lateral solidification process is made using a mask with a slit pattern proceeding in the horizontal direction. It can be known from the drawing that the grains are grown perpendicular to the slit pattern.

In this preferred embodiment, in order to grow the grains in the horizontal direction or in the vertical direction to bear the desired size, the slit pattern is gradually enlarged or reduced in width in the horizontal direction or in the vertical direction.

Figure 3:
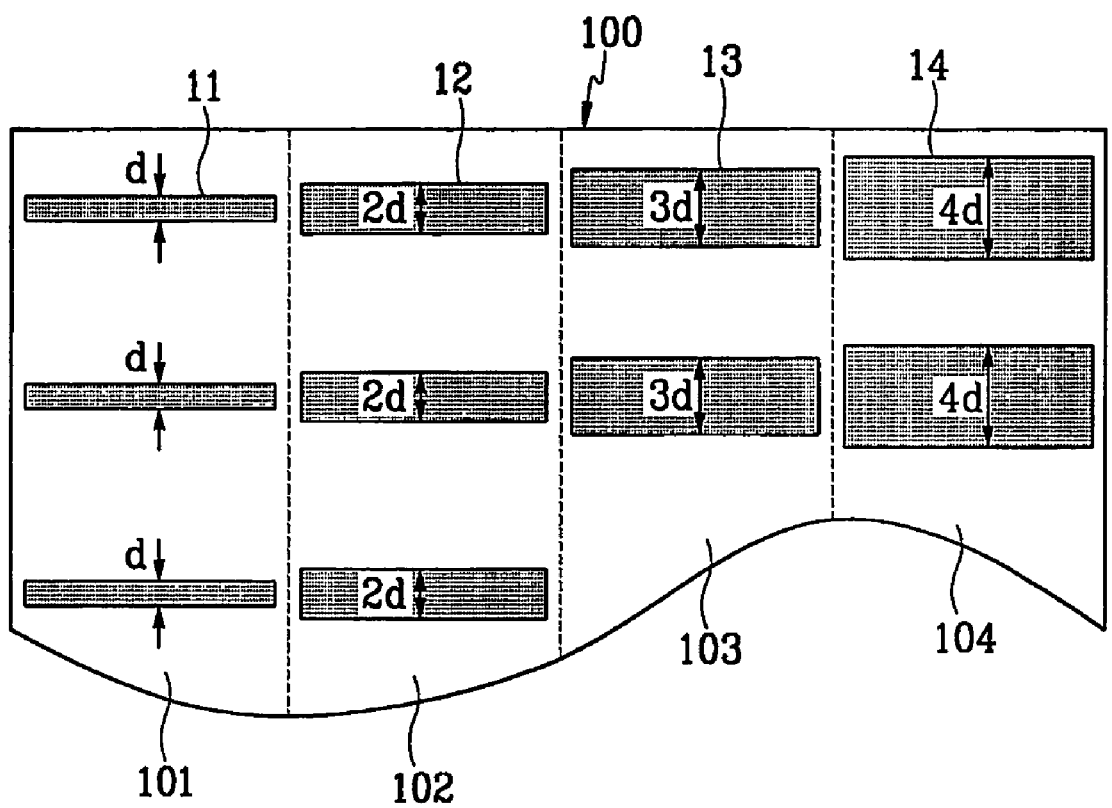
FIG. 3 is a plan view illustrating the structure of a polysilicon formation mask for crystallizing amorphous silicon into polysilicon according to a preferred embodiment of the present invention.

FIG. 3 is a plan view of a polysilicon formation mask for crystallizing amorphous silicon into polysilicon.

As shown in FIG. 3, the mask 100 has a first slit region 101 where a plurality of horizontal slit patterns 11 are arranged in the vertical direction while bearing the same width, a second slit region 102 where a plurality of horizontal slit patterns 12 are arranged in the vertical direction while bearing the same width, a third slit region 103 where a plurality of horizontal slit patterns 13 are arranged in the vertical direction while bearing the same width, and a fourth slit region 104 where a plurality of horizontal slit patterns 14 are arranged in the vertical direction while bearing the same width. The slit patterns 11 to 14 arranged at the first to fourth slit regions 101 to 104 are sequentially enlarged in width in the horizontal direction in multiple proportion to the width d of the slit pattern 11 at the first slit region 101. The centers of the slit patterns 11 to 14 arranged at the first to fourth slit regions 101 to 104 in the horizontal direction are placed at the same line. The slit patterns 11 to 14 arranged at the respective slit regions 101 to 104 in the vertical direction are spaced from each other with a distance of 8*d.

Alternatively, the first to fourth slit regions 101 to 104 may be arranged in reverse order, or in the vertical direction. Of course, it is also possible that the number of slit regions may be increased to bear slit patterns with a width of more than 4d, or decreased to bear slit patterns with a width of less than 4d. In this case, the distance between the slit patterns at each slit region is altered accordingly.

The sequential lateral solidification process is made with respect to the amorphous silicon layer 200 by illuminating laser beams onto the target area through the mask while moving the mask by the width A of the respective slit regions 101 to 104 being ¼ of the mask length. At this time, the amorphous silicon layer 200 suffers laser illumination through the respective slit regions 101 to 104. With the laser illumination, the crystalline particles of the amorphous silicon layer 200 are grown perpendicular to the boundary of the slit patterns. This process will be now explained with reference to FIGS. 4A and 4B.

Figure 4A:
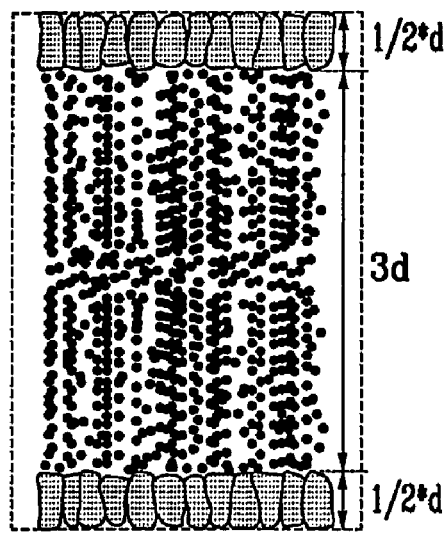
FIGS. 4A to 4D illustrate the micro-structure of polysilicon during the process where amorphous silicon is crystallized into the polysilicon through the sequential lateral solidification based on the mask for the polysilicon shown in FIG. 3.
Figure 4B:
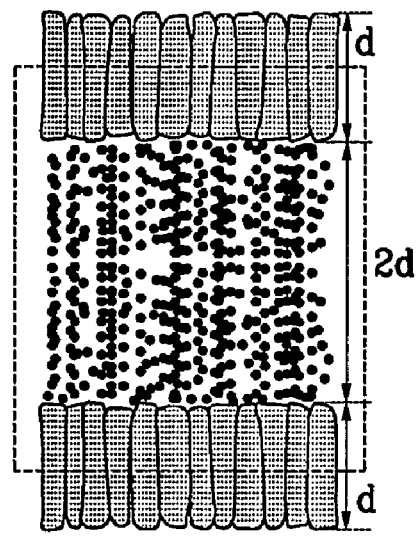

FIGS. 4A and 4B illustrates the structure of the grains grown in the sequential lateral solidification process using the polysilicon formation mask shown in FIG. 3.

In case the laser is illuminated through the fourth slit region 104, as shown in FIG. 4A, a liquid phase region is formed at the amorphous silicon layer 200 corresponding to the fourth slit region 104, and the crystalline particle grains are grown from the interface between the liquid phase region and the solid phase region perpendicular thereto by ½*d.

Thereafter, the mask 100 moves by the slit region width A, and laser is illuminated through the third slit region 103. Consequently, as shown in FIG. 4B, the particles grown in the previous processing step become to be seeds, and the crystalline particle grains are again grown by ½*d so that the particle length becomes to be d.

Figure 4C:
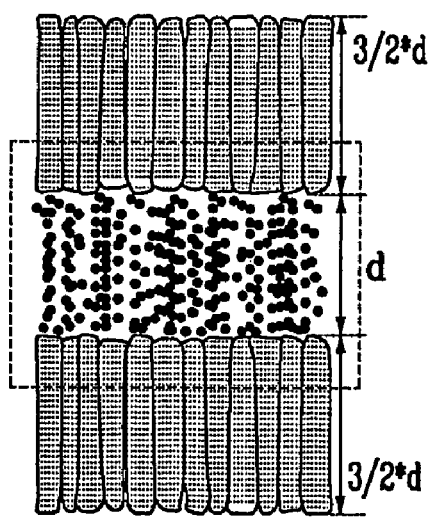
Figure 4D:
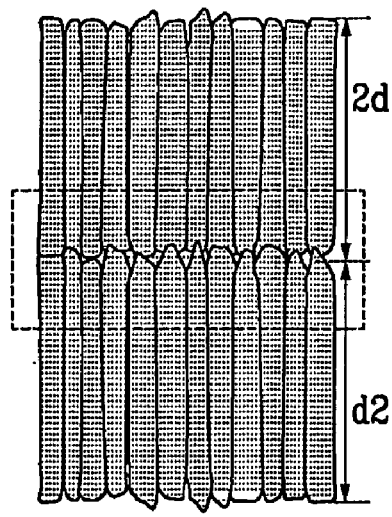

Thereafter, the mask 100 moves by the slit region width A, and laser is illuminated through the second slit region 102. In the same way, the mask 100 moves by the slit region width A, and laser is illuminated through the first slit region 101. Consequently, as shown in FIGS. 4C and 4D, the particles grown in the previous processing steps become to be seeds, and the crystalline particles grains are again grown by ½*d so that the particles length becomes to be ³⁄₂*d, and finally to be 2*d.

Like the above, when the first sequential lateral solidification process is made while moving the mask 100 from the left to the right, a multiply crystallized area where the crystalline particle length is 2d, and a non-crystallized area with a width of 4d corresponding to the area between the slit patterns are resulted. Thereafter, the mask 100 moves in the vertical direction by 4d such that the first to fourth slit regions 101 to 104 correspond to the non-crystallized area. In this state, the second sequential lateral solidification process is made while moving the mask from the right to the left. Consequently, the particles formed at the first sequential lateral solidification process become to be seeds, and the crystalline particle grains are again grown by 2d at the second sequential lateral solidification process so that the particle length becomes to be 4d.

In case nth slit region is present at the mask and the sequential lateral solidification process is repeatedly made through the mask, the resulting polysilicon particles have a length of n*d.

A method of fabricating a thin film transistor using the mask will be now explained in detail.

Figure 5:
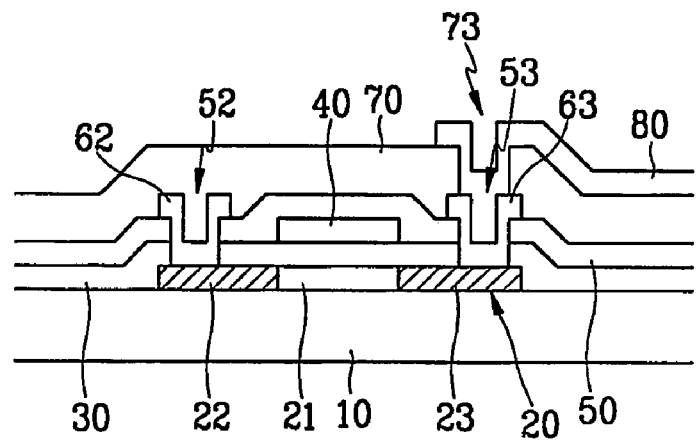
FIG. 5 is a cross sectional view of a polysilicon thin film transistor according to a preferred embodiment of the present invention.

FIG. 5 is a cross sectional view of a polysilicon thin film transistor according to a preferred embodiment of the present invention, and FIGS. 6A to 6E sequentially illustrate the steps of fabricating the polysilicon thin film transistor. These processing steps may be well applied for use in the method of fabricating a semiconductor device for designing a driving IC on the liquid crystal panel.

As shown in FIG. 5, a semiconductor layer 20 is formed on an insulating substrate 10 with polysilicon while bearing a channel region 21, and source and drain regions 22 and 23 formed at both sides of the channel region 21. The source and the drain regions 22 and 23 are doped with n or p type impurities. The source and the drain regions 22 and 23 may contain a silicide layer. A gate insulating layer 30 is formed on the substrate 10 with silicon oxide $SiO_2$ or silicon nitride $SiN_x$ while covering the semiconductor layer 20. A gate electrode 40 is formed on the gate insulating layer 30 over the channel region 21. An inter-layered insulating layer 50 is formed on the gate insulating layer 30 while covering the gate electrode 40. The gate insulating layer 30 and the inter-layered insulating layer 50 have contact holes 52 and 53 exposing the source and the drain regions 22 and 23 of the semiconductor layer 20. A source electrode 62, and a drain electrode 63 facing the source electrode 62 around the gate electrode 40 are formed on the inter-layered insulating layer 50 such that the source electrode 62 is connected to the source region 22 through the contact hole 52, and the drain electrode 63 is connected to the drain region 23 through the contact hole 53. A protective insulating layer 70 covers the inter-layered insulating layer 50 while bearing a contact hole 73 exposing the drain electrode 63. A pixel electrode 80 is formed on the protective insulating layer 70 with indium tin oxide (ITO), indium zinc oxide (IZO) or a reflective conductive material while being connected to the drain electrode 63 through the contact hole 73.

Figure 6A:
FIGS. 6A to 6E sequentially illustrate the steps of fabricating the polysilicon thin film transistor shown in FIG. 4.

In a method of fabricating the thin film transistor array substrate, as shown in FIG. 6A, an amorphous silicon layer is deposited onto a substrate 10 through low pressure chemical vapor deposition, plasma chemical vapor deposition, or sputtering.

Figure 6B:
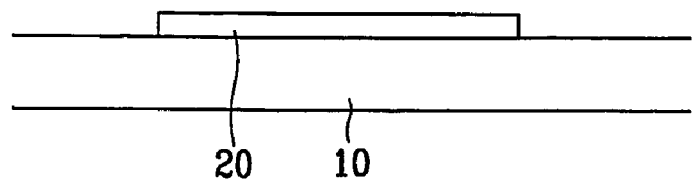

Thereafter, as shown in FIG. 6B, laser beams are illuminated onto the amorphous silicon layer through the mask shown in FIG. 3 to thereby form a liquid phase region at the amorphous silicon layer. A sequential lateral solidification process is made with respect to the amorphous silicon layer with the liquid phase region while growing the crystalline particle grains to thereby form a polysilicon semiconductor layer 20. The crystalline particles of the polysilicon semiconductor layer 20 bear a sufficiently large size so that the current mobility of the resulting thin film transistor can be maximized.

Figure 6C:
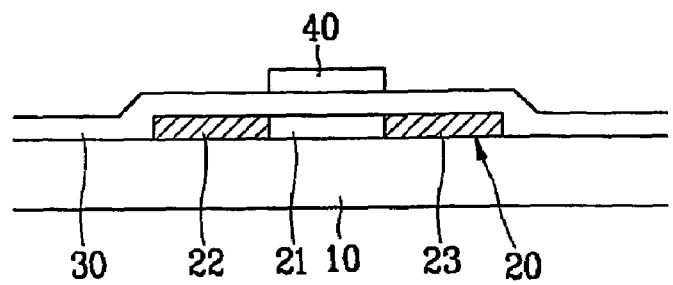

As shown in FIG. 6C, n or p type impurities are ion-implanted into the semiconductor layer 20 using the gate electrode 40 as a mask, and activated to thereby form source and drain regions 22 and 23. The region between the source and the drain regions 22 and 23 is defined as a channel region 21.

Figure 6D:
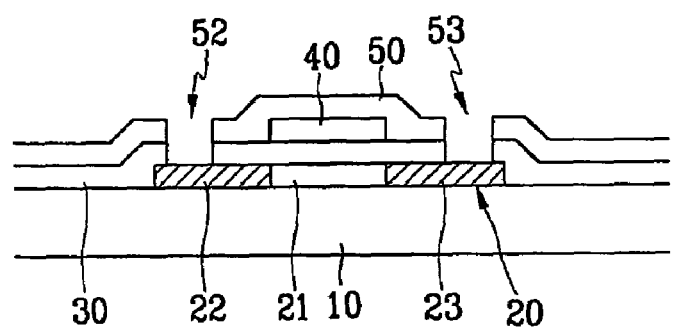

As shown in FIG. 6D, an inter-layered insulating layer 50 is formed on the gate insulating layer 30 such that it covers the gate electrode 40. The inter-layered insulating layer 50 is patterned together with the gate insulating layer 30 to thereby form contact holes 52 and 53 exposing the source and the drain regions 22 and 23 of the semiconductor layer 20.

Figure 6E:
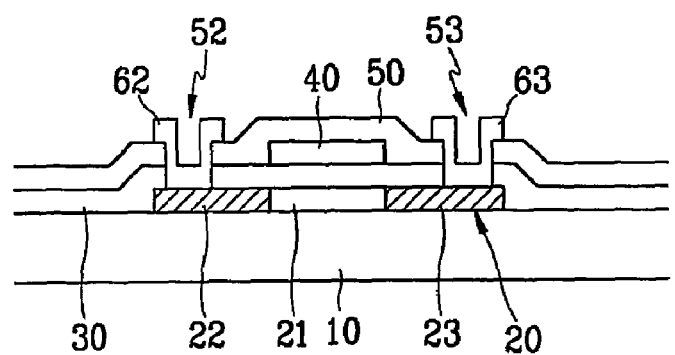

As shown in FIG. 6E, a metallic layer is deposited onto the substrate 10, and patterned to thereby form source and drain electrodes 62 and 63 such that the source and the drain electrodes 62 and 63 are connected to the source and the drain regions 22 and 23 through the contact holes 52 and 53, respectively.

Thereafter, as shown in FIG. 5, a protective insulating layer 70 is deposited onto the inter-layered insulating layer 50 overlaid with the source and the drain electrodes 62 and 63, and patterned to thereby form a contact hole 73 exposing the drain electrode 63. Then, a conductive layer based on a transparent conductive material such as ITO and IZO or a reflective conductive material is deposited onto the protective insulating layer 70, and patterned to thereby form a pixel electrode 80. The pixel electrode 80 is connected to the drain electrode 63 through the contact hole 73.

As described above, amorphous silicon is crystallized into polysilicon using a polysilicon mask with slit patterns sequentially enlarged in width so that the particle size of the polysilicon can be controlled in an appropriate manner. In this way, the current mobility of the polysilicon thin film transistor can be maximized.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method of fabricating a thin film transistor, the method comprising the steps of:

depositing an amorphous silicon layer onto an insulating substrate;

forming a semiconductor layer through crystallizing the amorphous silicon layer through a sequential lateral solidification process using a polysilicon formation mask where slit patterns for defining light transmission regions are arranged while being sequentially reduced or enlarged in width in a predetermined direction;

forming a gate insulating layer on the substrate such that the gate insulating layer covers the semiconductor layer;

forming a gate electrode on the gate insulating layer over the semiconductor layer;

forming source and drain regions at the semiconductor layer through implanting impurities into the semiconductor layer;

forming an inter-layered insulating layer such that the inter-layered insulating layer covers the gate electrode;

etching the inter-layered insulating layer and the gate insulating layer to thereby form contact holes exposing the source and the drain regions; and forming source and drain electrodes such that the source and the drain electrodes are connected to the source and the drain regions through the contact holes.

2. The method of claim 1, further comprising the step of forming a pixel electrode such that the pixel electrode is connected to the drain electrode.

3. The method of claim 2, wherein the pixel electrode is formed with a transparent conductive material or a reflective conductive material.

4. The method of claim 1, wherein the slit patterns are arranged at two or more different regions such that the slit patterns at the same region have the same width, and the sequential lateral solidification process is made while moving the mask by the width of each region in the predetermined direction.

* * * * *